United States Patent [19]

Beasom

[11] Patent Number: 4,729,008
[45] Date of Patent: Mar. 1, 1988

[54] HIGH VOLTAGE IC BIPOLAR TRANSISTORS OPERABLE TO $BV_{CBO}$ AND METHOD OF FABRICATION

[75] Inventor: James D. Beasom, Melbourne, Fla.

[73] Assignee: Harris Corporation, Melbourne, Fla.

[21] Appl. No.: 883,279

[22] Filed: Jul. 7, 1986

Related U.S. Application Data

[63] Continuation of Ser. No. 447,945, Dec. 8, 1982, abandoned.

[51] Int. Cl.⁴ .................. H01L 29/70; H01L 29/80; H01L 27/06
[52] U.S. Cl. ........................... 357/43; 357/22; 357/49; 357/71
[58] Field of Search ................. 357/22, 43, 49, 71

[56] References Cited

U.S. PATENT DOCUMENTS

| | | |
|---|---|---|
| 3,412,296 | 11/1968 | Grebeue ................... 357/43 |
| 3,576,475 | 4/1971 | Kronlage . |
| 3,595,715 | 7/1971 | Thire et al. . |
| 3,597,287 | 8/1971 | Koepp .................... 357/22 |
| 3,865,649 | 2/1975 | Beasom ................... 357/49 |
| 3,955,269 | 5/1976 | Magdo et al. ........... 357/43 |
| 4,049,476 | 9/1977 | Horie ...................... 357/43 |
| 4,095,252 | 6/1978 | Ochi . |
| 4,143,392 | 3/1979 | Mylroie .................. 357/43 |
| 4,150,392 | 4/1979 | Nonaka ................... 357/43 |
| 4,176,368 | 11/1979 | Compton ................ 357/43 |
| 4,255,671 | 3/1981 | Nonaka et al. ......... 357/22 |
| 4,299,024 | 11/1981 | Piotrowski ............. 357/71 |
| 4,314,267 | 2/1982 | Bergeron et al. ...... 357/22 |
| 4,322,738 | 3/1982 | Bell et al. . |
| 4,412,238 | 10/1983 | Khadder et al. ....... 357/22 |
| 4,494,134 | 1/1985 | Wildi et al. ............ 357/22 |

FOREIGN PATENT DOCUMENTS

| | | | |
|---|---|---|---|
| 45447 | 8/1980 | European Pat. Off. ...... 357/22 |
| 52-44574 | 4/1977 | Japan ...................... 357/22 |
| 53-67369 | 6/1978 | Japan ...................... 357/43 |
| 53-67368 | 6/1978 | Japan ...................... 357/43 |

OTHER PUBLICATIONS

Wyland, "Improving Performance of Transistors", *IBM Technical Disclosure Bulletin*, Jun. 1970, pp. 204–205.

Primary Examiner—Andrew J. James
Assistant Examiner—Jerome Jackson, Jr.
Attorney, Agent, or Firm—Barnes & Thornburg

[57] ABSTRACT

A high voltage bipolar and JFET have their gate and base connected and source and collector connected and the appropriate geometry for the bipolar to operate to its $BV_{CBO}$ limit. The collector and channel regions have the same depth and impurity concentration, the base and top gate regions have the same depth and impurity concentration and the emitter and source and drain regions have the same depth and impurity concentration.

14 Claims, 11 Drawing Figures

HIGH VOLTAGE IC BIPOLAR TRANSISTORS OPERABLE TO $BV_{CBO}$ AND METHOD OF FABRICATION

This is a continuation of application Ser. No. 447,945, filed Dec. 8, 1982 and now abandoned.

BACKGROUND OF THE INVENTION

The present invention relates generally to high voltage integrated circuits and, more specifically to a bipolar transistor in an intergrated circuit capable of achieving operation to $BV_{CBO}$ rather than $BV_{CEO}$ limit.

It is well-known that $BV_{CEO}$ is less than $BV_{CBO}$ in transistors with a uniform collector doping due to carrier multiplication by the emitter base junction. The relation between the two breakdowns is:

$$BV_{CEO} = \frac{BV_{CBO}}{H_{FE}{}^{1/n}}.$$

In silicon devices $n \approx 4$ for NPN's and $n \approx 6$ for PNP's. It is found in many devices that $BV_{CEO} < \frac{1}{2} BV_{CBO}$ as a result of this relationship. It is also well known that $BV_{CBO} \propto N_C{}^{-\frac{3}{4}}$. Consequently, to increase $BV_{CBO}$ and thus $BV_{CEO}$, one must decrease $N_C$, the doping of the collector region, and thus increase its resistivity in inverse proportion. Transistor collector resistance is directly proportional to collector resistivity and inversely proportional to device area. Thus, when collector resistivity is increased to increase $BV_{CEO}$, device area must also be increased to achieve a given value of collector resistance. Large device areas are costly to manufacture and therefore one seeks ways to minimize collector area. One method is to use designs which allow operation to the $BV_{CBO}$ rather than the $BV_{CEO}$ limit of the transistor.

SUMMARY OF THE INVENTION

An object of the present invention is to provide an integrated circuit design which allows a bipolar transistor to operate to the $BV_{CBO}$ rather than the $BV_{CEO}$ limit of operation.

Another object of the present invention is to provide a high voltage junction field effect transistor which can be used with a bipolar transistor to allow the bipolar transistor to operate to its $BV_{CBO}$ level.

A still further object of the present invention is to fabricate an integrated circuit having high voltage bipolar and junction field effect transistors using the steps necessary only to form the bipolar devices.

These and other objects of the invention are attained by providing an integrated circuit having bipolar and junction field effect transistors with the base and gate being connected together, the source and collector being connected together and the geometry of the bipolar and junction field effect transistors defining $I_{dss} \geq I_C{}_{max}$ and $BV_{dg} \geq BV_{CBO}$. The high voltage which is normally applied to the collector of the bipolar transistor is now applied to the drain of the junction field effect transistor such that the major voltage drop is across the drain-gate junction of the junction field effect transistor with only a low voltage across the gate-source junction which is common to the collector of the bipolar transistor. Thus, the maximum voltage which the circuit can withstand between the junction field effect transistor drain and the bipolar emitter is $BV_{dg} + V_{BE}$.

A junction field effect transistor suitable for high voltage applications is fabricated wherein the channel region has the same depth and impurity concentration as the collector region of the bipolar transistor. The top gate has the same impurity concentration and depth as the base of the bipolar transistor and the source and drain regions have the same depth and impurity concentration as the emitter of the bipolar transistor. The top gate extends beyond the lateral edges of the channel region between the source and drain region and a bottom gate is provided which extends laterally beyond the channel region such that the intersection of the channel region with the top and bottom gates approach planar breakdown and, thus, have an increased breakdown relationship.

The method of fabricating the bipolar and junction field effect transistors includes simultaneously forming the channel region of the junction field effect transistor and the collector region of the bipolar transistor. Next, the top gate region of the junction field effect transistor and the base region of the bipolar transistor are formed simultaneously. This is followed by the simultaneous formation of the source and drain regions of the junction field effect transistor and the emitter regions of the bipolar transistor. A bottom gate region is formed before the formation of the top gate region as a buried region. The pair of bipolar and junction field effect transistors may be formed in separate isolated region or may be formed in a merged structure. A lateral region which laterally surrounds the channel region is formed and interconnects the top and bottom gates which extend laterally beyond the channel region. Beginning with an N substrate, the PNP and PJFET use the substrate as the lateral region. For the NPN and NJFET combination, the substrate forms the channel and the collector region and the connecting region is a diffused P type region.

Other objects, advantages and novel features of the present invention will become apparent upon review of the detailed description in combination with the accompanying claims.

DESCRIPTION OF THE PREFERRED EMBODIMENTS

Figure 1:
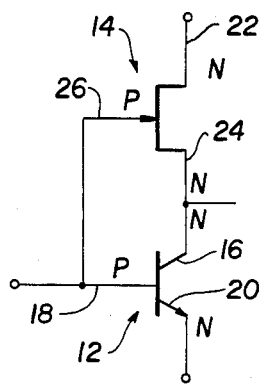
FIG. 1 is a schematic of a NPN and NJFET incorporating the principles of the present invention.
Figure 2:
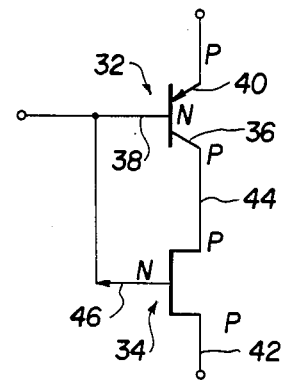
FIG. 2 is a schematic of a PNP and PJFET incorporating the principles of the present invention.

A circuit configuration allowing a bipolar transistor to operate to the $BV_{CBO}$ limit is illustrated in FIGS. 1 and 2 as including bipolar transistor and a junction field effect transistor with the source and collector connected in common and the gate and base connected in common. The high voltage is applied to the drain and the input may be either on the base or emitter of the bipolar transistor and the output taken off the collector. Thus, the present invention is applicable to the common base as well as the common emitter circuit configuration for the bipolar transistor. As illustrated specifically in FIG. 1, an NPN transistor 12 is connected to a N channel junction field effect transistor 14. The bipolar transistor 12 includes a collector 16, a base 18 and an emitter 20 and the NJFET includes a drain 22, a source 24 and a gate 26. The gate 26 is connected to the base 18 and the collector 16 is connected to the source 24. FIG. 2 illustrates a PNP transistor 32 and a PJFET 34. The NPN transistor 32 includes a collector 36, a base 38 and an emitter 40 and the PJFET includes a drain 42, a source 44 and a gate 46. The base 38 and gate 46 are connected together and the collector 36 and the source 44 are connected together.

The operation of the circuit can be understood by consideration of the NPN-NJFET cascade pair of FIG. 1. The high voltage which would be applied to the collector of the simple NPN is now applied to the drain 22 of the NJFET. The voltage drop is across the drain-gate junction of the JFET with only the low JFET gate-source voltage occurring across the bipolar transistor.

For an exact analysis, the following equations apply:

$$I_{ds} = I_{dss}\left(1 + \frac{V_{gs}}{V_p}\right)^2, \quad v_{ds} > V_p - V_{gs} \tag{1}$$

(2) $I_{ds} = I_c$
(3) $V_{gs} = -V_{CB}$ from which $$I_c = I_{dss}\left(1 - \frac{V_{CB}}{V_p}\right)^2 \tag{4}$$

$$V_{CB} = V_p\left(1 - \sqrt{\frac{I_c}{I_{dss}}}\right) \tag{5}$$

The FET geometry is chosen to give $I_{dss} \geq I_c$ and $BV_{dg} \geq BV_{CBO}$. Therefore, Equation 5 becomes:

$$V_{CB} \leq V_p$$

Thus, when $V_p < BV_{CEO}$, the JFET absorbs the high voltage applied at its drain and the maximum voltage which the circuit can withstand between JFET drain and NPN emitter is $BV_{dg} + V_{BE}$. As will be shown below, it is possible to build JFET's whose $BV_{dg} > BV_{CBO}$ using the same process steps used to form high voltage PNP's and NPN's, and, thus, the cascade circuitry can be used to extend the device operating voltage to $BV_{CBO}$.

While the condition $V_p < BV_{CEO}$ assures that transistor $BV_{CEO}$ is not exceeded, it is an overly restrictive condition on $V_p$ for cases where $I_c$ does not go to zero. This can be seen by examination of Equation (5) where the term $I_c/I_{dss}$ reduces the maximum $V_{CB}$ below $V_p$. The term can be set at any desired value by adjusting the geometry (W/L) of the JFET to set $I_{dss}$ so as to achieve that value.

The PJFET cascade of the PNP of FIG. 2 works in an exactly analogous way and the same equations apply with appropriate change in signs for P type devices.

The circuit yields an output resistance increase as a result of the cascade action. Consequently, it can be used simultaneously to increase the transistor's output resistance and its maximum operating voltage. In this application, the circuit affords the advantages that it requires a minimum number of devices and a minimum of circuit interconnect to accomplish its function.

Figure 3:
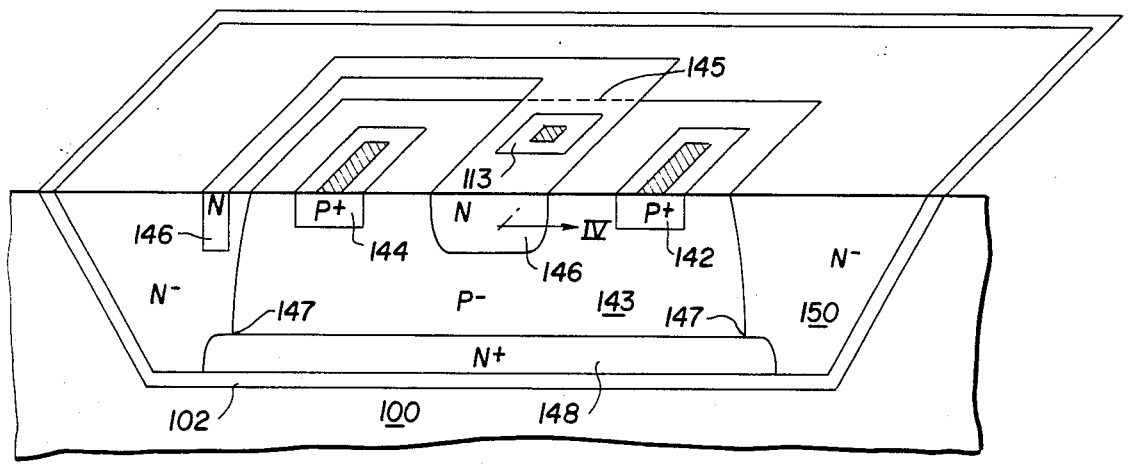
FIG. 3 is a cross-sectional—perspective view of a high voltage P channel JFET incorporating the principles of the present invention.

A PJFET capable of high voltage operation is illustrated in FIG. 3 as including P− channel region 143 having P+ source 144 and P+ drain 142 therein. An N top gate 146 is formed in the P− channel region 143 between the source and drain regions 144 and 142. An N+ bottom gate region 148 is at the bottom of the P− channel region 143 and is connected to the top gate by laterally surrounding N− region 150. The top gate 146 extends beyond the P− channel region 143 and encompasses the source region 144. The bottom gate region 148 has a lateral area sufficient to extend beyond the channel region 143 in all directions.

Figure 4:
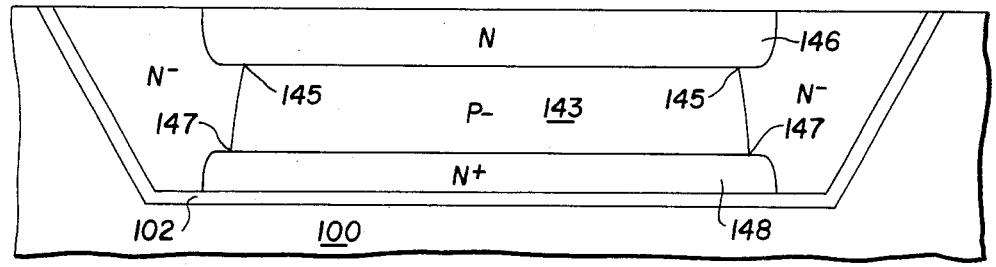
FIG. 4 is a cross-sectional view taken along the lines IV—IV of FIG. 3.

The P− channel region 143 intersects the top gate region 146 at junction 145 such that the breakdown voltage is at the cylindrical limit which is greater than or equal to the $BV_{CBO}$ of a PNP transistor. The intersection 147 of the channel region 143 and the bottom gate 148 gives a plane breakdown limit. Thus, high breakdown voltages of these intersections are achieved. It should also be noted that the top gate region 146 encompasses the source region 142 and therefore acts as a channel stop to prevent inversion between the drain and source. As illustrated in FIGS. 3 and 4, the PJFET is dielectrically isolated by an insulative region 102 in a support 100 which may be polycrystalline material. As will be explained more fully below, the connecting region 150 is an N− substrate with the remaining regions being diffused regions.

To achieve the desired characteristics mentioned above, the P− channel region 143 has the same depth and impurity concentration and will be formed during the same process step as the collector region of the PNP bipolar device which is part of the pair provided to produce the schematic of FIG. 2. The top gate region 146 has the same depth and impurity concentration and is formed simultaneously with the base of the PNP transistor. The source and drain regions 142 and 144 have the same depth and impurity concentration and are formed simultaneously with the emitter region of the PNP transistor. The simultaneously formed PJFET and PNP devices may be formed in a separate dielectrically isolated island.

Figure 5:
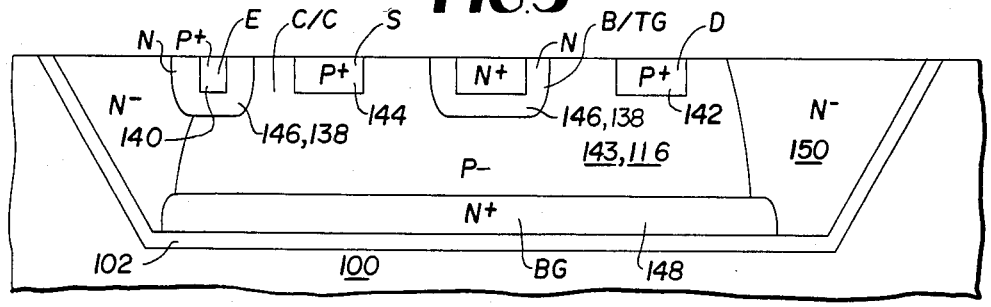
FIG. 5 is a cross-sectional view of a merged PNP-PJFET incorporating the principles of the present invention.

Alternatively, a merged logic configuration may be used to achieve the schematic of FIG. 2. FIG. 5 specifically illustrates a merged logic configuration wherein the top gate region 146 is enlarged to form a top gate region 146 and base region 138. The emitter region 140 is a P+ region formed in the extended combined base/top gate region 138/146 to form a vertical transistor with the common collector/channel region 116/143.

Figure 6:
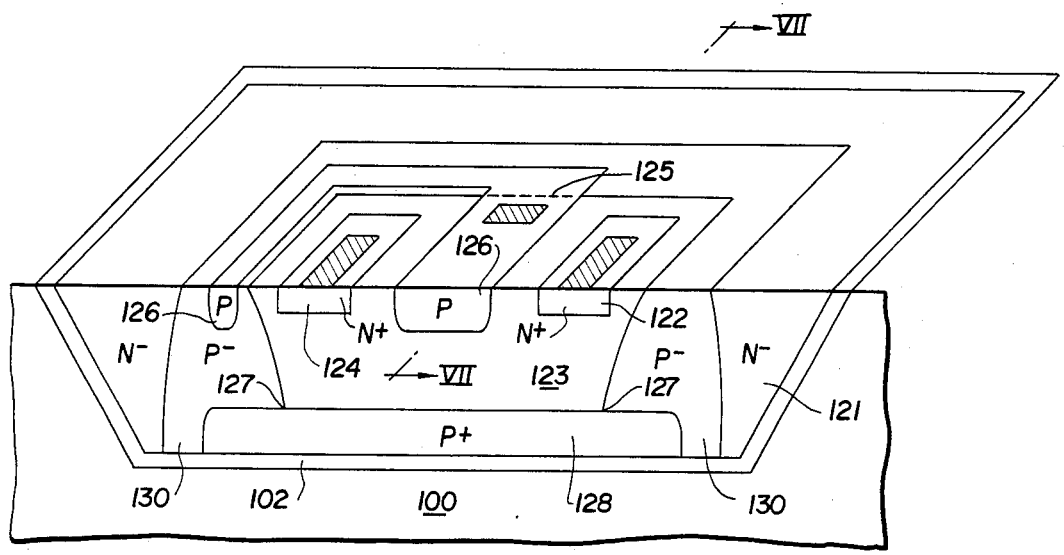
FIG. 6 is a cross-sectional—perspective view of an N channel JFET incorporating the principles of the present invention.
Figure 7:
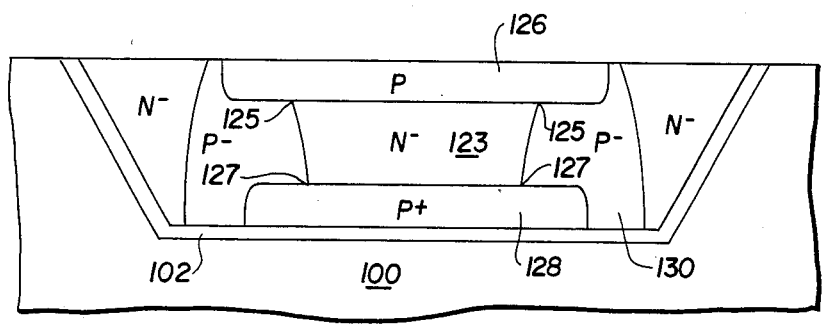
FIG. 7 is a cross-sectional view taken along the lines VII—VII of FIG. 6.

An NJFET capable of high voltage operation is illustrated in FIGS. 6 and 7. An N− channel region 123 includes N+ drain region 122 and N+ source region 124. A P top gate region 126 is formed in the N− channel region 123 between the source and drain regions and a P+ bottom gate 128 is formed below the N− channel region 123. A P− lateral area 130 connects the bottom gate 128 and the top gate 126 and laterally surrounds the channel region 123 separating it from the remainder of the N− island 121. As in the previous embodiment, the P gate region 126 extends laterally beyond the channel region 123 forming a junction 125 therewith and the bottom gate region 128 extends past the channel 123 forming the junction 127 therewith. As discussed above, this increases the breakdown limits of these junctions for the required high voltage performance.

The N− channel region 123 has the same depth and impurity concentration as the collector region of an NPN bipolar transistor which forms the other portion of the pair to construct the circuit of schematic of FIG. 1. The top gate region 126 has the same depth and impurity concentration as the base portion of the NPN transistor and the source and drain regions 124 and 122 have the depth and impurity concentration as the emitter of the NPN transistor. The N− collector region 123 and the remaining portion 121 are the original substrate of the dielectrically isolated islands and the P− region 130 connecting the top and bottom gate is a result of the collector diffusion used to form the PNP of a bipolar transistor complementary to the NPN of the present pair.

Figure 8:
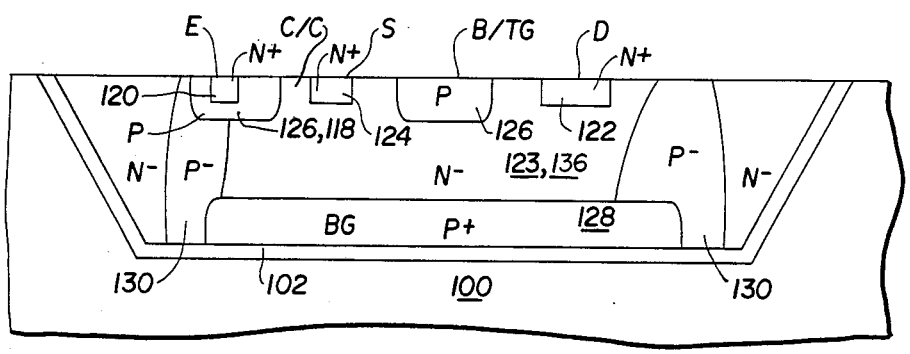
FIG. 8 is a cross-sectional view of a merged NPN-PJFET incorporating the principles of the present invention.

As with the PJFET, the NJFET may be formed as a merged structure with its NPN and is specifically illustrated in FIG. 8. The top gate region 126 is extended to form the top gate/base region 126/118. An N+ emitter region 120 is formed in the extended top gate/base region 126/118. The N− channel region also forms the collector region 123/116.

Figure 9:
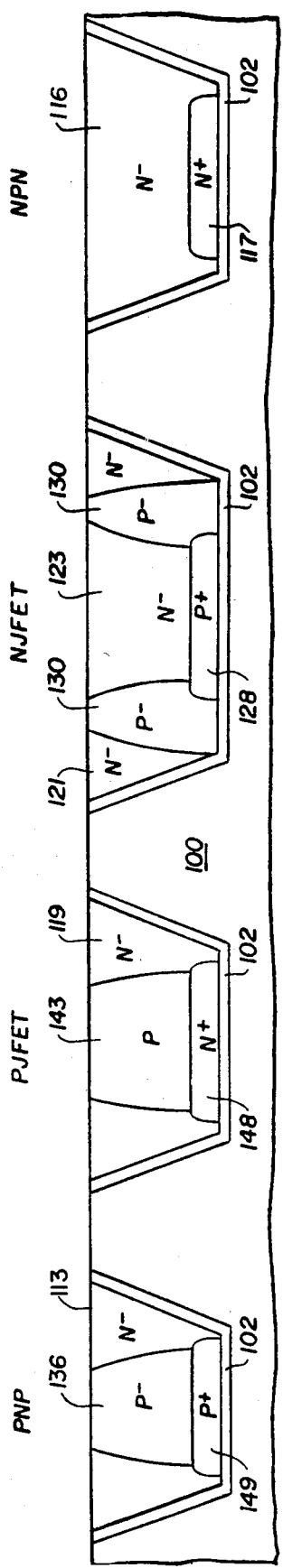
FIGS. 9–11 are cross-sectional views of a wafer illustrating the transistors at various stages of fabrication.
Figure 10:
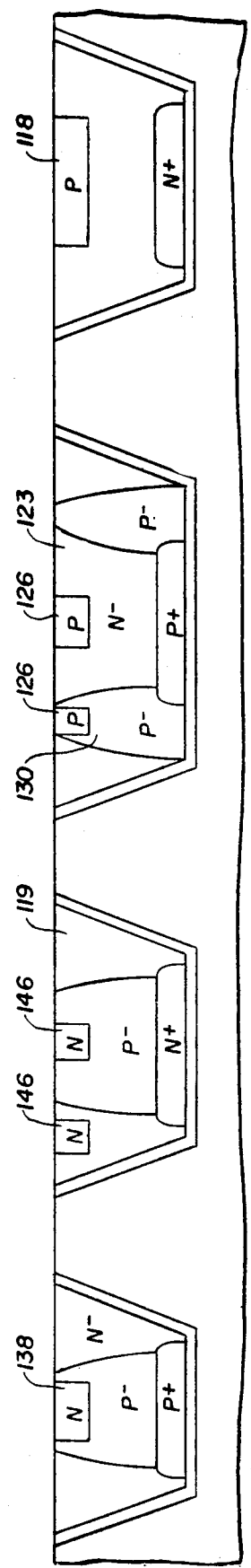
Figure 11:
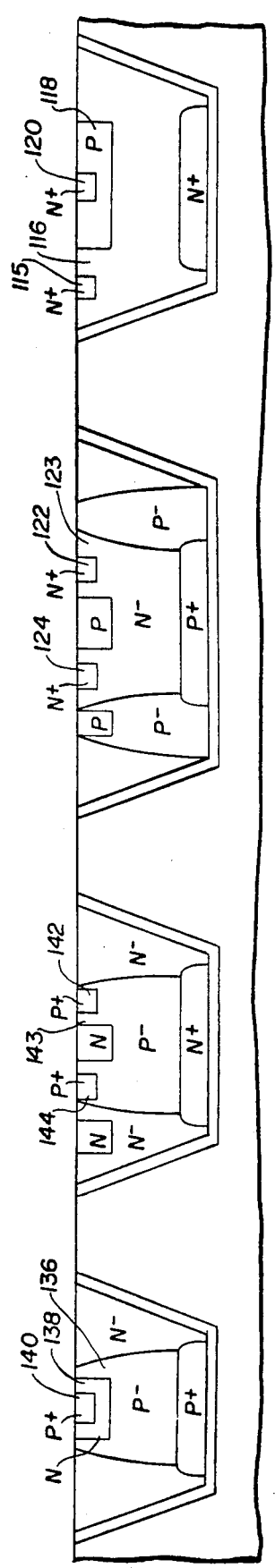

The process of fabrication which allows the formation of the high voltage junction field effect transistors using the steps of forming high voltage bipolar transistors is illustrated in FIGS. 9–11. The formation of dielectrically isolated N− regions 113, 119, 121 and 116 with buried P+ region 149, N+ region 148, P+ region 128 and N+ region 117, respectively, and P− collector region 136, P− channel region 143, P− lateral and connecting region 130, respectively, are produced by well-known methods of the prior art.

A method of forming dielectric isolations with buried regions and back diffused P regions in N islands is described in U.S. Pat. No. 3,865,649 to Beasom. Although this patent describes only N buried region, the P+ and N+ regions may be selectively formed before the formation of the dielectric isolated layer 102 and the polycrystalline base 100. By using this process, the P− collector region 136 has the depth and impurity concentration as the P− channel region 143. The connecting regions 130 of NJFET isolate the N− tub 121 from the channel region 123 which is part of the original tub. Although the P− region 130 is shown with portions of the original N− substrate 121 outside thereof and the collector region 136 shows remaining portions of the N− region 115, the diffusion may be carried out so as to eliminate these regions, if desired.

The wafer at this stage of fabrication is illustrated in FIG. 9.

In the next step, the common base and top gate regions of the appropriate pairs are formed. To be more specific, N type impurities are introduced into collector region 136 and channel region 143 and portions of the lateral area 119 to form base region 138 and top gate region 146 simultaneously. This is followed by the introduction of P type impurities to form base region 118 in collector region 116 and top gate region 126 in channel region 123 and connecting region 130. The structure at this stage is illustrated in FIG. 10.

The next step is to simultaneously form the emitter regions of the bipolar transistors and the source and drain regions of the junction field effect transistors. N type impurities are introduced into channel region 123 to form source and drain regions 124 and 122 and into base region 118 to form emitter region 120. Also, N type impurities are introduced into the collector region 116 to form collector contact 115. P type impurities are then introduced to form emitter region 140 in base region 138 and source and drain regions 144 and 142 in channel region 143. The wafer at this stage of fabrication is illustrated in FIG. 11.

It should be noted that it is well-known to introduce impurities by deposition and diffusion or by implantation and diffusion to the final depth. The use of masking layers and other devices are well-known and, therefore, has not been described or illustrated in detail. The devices formed in individually dielectric isolation are interconnected by surface conductors which are insulated from the remainder of the integrated circuit by an insulating layer. For sake of clarity, these elements have not been illustrated.

Although the devices have been illustrated in FIGS. 3–11 as being formed in dielectrically isolated islands, it is evident that they may be formed in other isolated islands. For example, junction isolation may be used as well as the combination of dielectric and junction isolation which may include dielectric isolation along the lateral edges of the tubs and junction isolation at the bottom.

As is evident from the preceding description of the preferred embodiments, the objects of the invention are attained in that a bipolar transistor capable of operating to its $BV_{CBO}$ limit by use of a high voltage junction field effect transistor which may be fabricated using the steps only necessary to form the bipolar transistor is described. Although the invention has been described and illustrated in detailed it is to be clearly understood that the same is by way of example and illustration only and is not to be taken by way of limitation. The spirit and scope of the invention are to be limited only by the terms of the appended claims.

What is claimed is:

1. An integrated circuit including bipolar and junction field effect transistors comprising:
   an N substrate;
   a PNP bipolar transistor in said substrate having a collector, base and emitter region;
   a P channel junction field effect transistor in said substrate having a channel region of the same depth and impurity concentration as said PNP collector region, source and drain regions of the same depth and impurity concentration as said PNP emitter region, a top gate region of the same depth and impurity concentration as said PNP base region and extending laterally beyond said channel region into said substrate and a buried N bottom gate region in said substrate of a high impurity concentration than said substrate and extending laterally beyond said channel region into said substrate to be connected to said top gate region by said substrate; and means for connecting said top gate and said base regions and means for connecting said source and said collector regions.

2. The integrated circuit according to claim 1, wherein said top gate region extends laterally beyond the portion of said channel region between said source and drain regions, and said bottom gate region extends laterally beyond said channel region in all lateral directions.

3. An integrated circuit including bipolar and junction field effect transistors comprising:

an N substrate;

an NPN bipolar transistor in said N substrate having a collector, base and emitter region;

a PNP bipolar transistor in said substrate having a collector, base and emitter region;

an N channel junction field effect transistor in said substrate having a channel region of the same depth and impurity concentration as said NPN collector region, source and drain regions having the same depth and impurity concentration as said NPN emitter region, a top gate having the same depth and impurity concentration as said NPN base region and extending laterally beyond said channel region, a buried P bottom gate region in said substrate extending laterally beyond said channel region and a lateral P region laterally surrounding said channel region and having the same depth and impurity concentration as said PNP collector region and connecting said top and bottom gate regions by a lower impurity region; and means for connecting said top gate and said base regions and means for connecting said source and said collector regions.

4. An integrated circuit according to claim 3, wherein said top gate extends laterally beyond the portion of said channel region between said source and drain regions, and said bottom gate region extends laterally beyond said channel region in all lateral directions.

5. An integrated circuit according to claim 3, wherein said N channel region and said NPN collector region are portions of said substrate.

6. An integrated circuit according to claim 3, including a P channel junction field effect transistor in said substrate having a channel region of the same depth and impurity concentration as said PNP collector region, source and drain regions having the same depth and impurity concentration as said PNP emitter region and a top gate having the same depth and impurity concentration as said PNP base region.

7. An integrated circuit according to claim 6 including means for connecting said P channel source and PHP collector regions, means for connecting said P channel gate and PNP base regions, means for connecting said N channel source and NPN collector regions, and means for connecting said N channel gate and NPN base regions.

8. An integrated circuit according to claim 3, wherein said lateral P region has a lower impurity concentration than said gate regions.

9. A bipolar transistor structure capable of operating to $VB_{CBO}$ comprising:

a bipolar transistor having a base of a first conductivity type and an emitter and a collector of a second conductivity type opposite said first conductivity type;

a junction field effect transistor having a top and bottom gate of said first conductivity type and a source, drain and channel of said second conductivity type;

said channel and said collector have the same depth and impurity concentration and said top gate and said base have the same depth and impurity concentration;

a connection region laterally encompassing said channel of said first conductivity type and lower impurity concentration than said gates, and extending from said bottom gate to a top surface adjacent said top gate;

said gate being connected to said base and said source being connected to said collector.

10. The integrated circuit according to claim 9, wherein said top gate region extends in at least one direction beyond said channel region into said a connecting region connecting said top and bottom gate regions.

11. An integrated circuit including bipolar transistors and junction field effect transistors comprising:

a bipolar transistor including a collector region of a first depth, impurity concentration and conductivity type, a base region in said collector region of a second depth, impurity concentration and conductivity type, and an emitter region in siad base region of a third depth and impurity concentration and of said first conductivity type;

a junction field effect transistor including a channel region of said first depth, impurity concentration and conductivity type; separate source and drain regions in said channel region of said third depth and impurity concentration and said first conductivity type; a top gate region in said channel region separating said source and drain regions of said second depth, impurity concentration and conductivity type; a buried bottom gate region of said second conductivity type and fourth impurity concentration; and a connecting region of said first conductivity type and a lower impurity concentration than said gates, laterally encompassing said channel region and extending from said bottom gate to a top surface adjacent said top gate; and means for connecting said gate regions to said base region and means for connecting said source region to said collector region.

12. The integrated circuit according to claim 11 including a second bipolar transistor having a collector region of said second conductivity type, a base region in said collector region of said first conductivity type and an emitter region in said base region of said second conductivity type; and wherein said connecting region has the same depth and impurity concentration as said collector of said second bipolar transistor.

13. The integrated circuit according to claim 11, wherein said top gate region extends laterally beyond said channel region in a direction transverse to the direction of separation of said source and drain regions into said connecting region.

14. The integrated circuit according to claim 11, wherein said bottom gate has a greater lateral area than said channel region and the bottom peripheral edge of said channel region terminates in said buried bottom gate region.

* * * * *